(12) United States Patent
Lin et al.

(10) Patent No.: US 11,733,267 B2
(45) Date of Patent: Aug. 22, 2023

(54) PROBE HEAD AND PROBE CARD

(71) Applicant: MPI Corporation, Hsinchu County (TW)

(72) Inventors: Che-Wei Lin, Hsinchu County (TW); Ting-Ju Wu, Hsinchu County (TW); Keng-Min Su, Hsinchu County (TW); Chin-Yi Lin, Hsinchu County (TW)

(73) Assignee: MPI CORPORATION, Hsinchu County (TW)

( * ) Notice: Subject to any disclaimer, the term of this patent is extended or adjusted under 35 U.S.C. 154(b) by 0 days.

(21) Appl. No.: 16/822,896

(22) Filed: Mar. 18, 2020

(65) Prior Publication Data

US 2020/0309819 A1 Oct. 1, 2020

(30) Foreign Application Priority Data

Mar. 27, 2019 (TW) .................................. 108110785

(51) Int. Cl.
*G01R 1/073* (2006.01)
*G01R 1/067* (2006.01)

(52) U.S. Cl.
CPC ..... *G01R 1/07314* (2013.01); *G01R 1/06733* (2013.01)

(58) Field of Classification Search
CPC .................. G01R 1/07314; G01R 1/06733
See application file for complete search history.

(56) References Cited

U.S. PATENT DOCUMENTS 5,137,456 A * 8/1992 Desai ................... H01R 12/714
439/74
6,150,830 A * 11/2000 Schmid .............. G01R 1/07357
324/756.03
7,471,096 B2 12/2008 Kohashi et al.
(Continued)

FOREIGN PATENT DOCUMENTS

CN 1227351 A 9/1999
EP 2645113 A2 10/2013
(Continued)

OTHER PUBLICATIONS

Extended European Search Report, dated Aug. 12, 2020, for European Application No. 20163270.0.

*Primary Examiner* — Paresh Patel
(74) *Attorney, Agent, or Firm* — Birch, Stewart, Kolasch & Birch, LLP

(57) ABSTRACT

A probe head includes an upper guide plate, a lower guide plate, and a plurality of probes. The upper guide plate includes a groove, and the upper guide plate is provided with an upper surface, a lower surface and a plurality of probe holes vertically penetrating the upper surface and the lower surface along a first direction. The groove is depressed from the upper surface, and provided with a groove bottom surface. The groove bottom surface is located between the upper surface and the lower surface. The lower guide plate is disposed on the upper guide plate. The probe is disposed in the groove. An end portion of a probe tail of the probe is located between the groove bottom surface and the upper surface. A probe card is also provided and the probe card includes a circuit board, a space transformer, and the probe head.

8 Claims, 11 Drawing Sheets

(56) References Cited

U.S. PATENT DOCUMENTS

| | | | | |
|---|---|---|---|---|
| 2006/0066328 A1* | 3/2006 | Clegg | ................ | G01R 1/07357 |
| | | | | 324/755.06 |
| 2006/0186905 A1* | 8/2006 | Kohashi | ............... | G01R 1/0466 |
| | | | | 324/750.25 |
| 2012/0319711 A1* | 12/2012 | Hung | ................ | G01R 1/07371 |
| | | | | 324/750.16 |
| 2014/0118016 A1 | 5/2014 | Breinlinger et al. | | |
| 2017/0307856 A1 | 10/2017 | Vallauri | | |

FOREIGN PATENT DOCUMENTS

| | | | |
|---|---|---|---|
| EP | 3028440 | A | 8/2016 |
| JP | 2005-127794 | A | 5/2005 |
| JP | 2015-25749 | A | 2/2015 |
| JP | 2016-99337 | A | 5/2016 |
| JP | 2018-179721 | A | 11/2018 |
| TW | 200635153 | A | 10/2006 |
| TW | M303381 | | 12/2006 |
| TW | 201629494 | A | 8/2016 |
| TW | 201632891 | A | 9/2016 |
| TW | 201821809 | A | 6/2018 |
| WO | WO 2018/019863 | A1 | 2/2018 |
| WO | WO 2018/193832 | A1 | 10/2018 |

* cited by examiner

PROBE HEAD AND PROBE CARD

CROSS-REFERENCE TO RELATED APPLICATION

This non-provisional application claims priority under 35 U.S.C. § 119(a) to Patent Application No. 108110785 in Taiwan, R.O.C. on Mar. 27, 2019, the entire contents of which are hereby incorporated by reference.

BACKGROUND

Technical Field

Embodiments of the invention relate to a probe head (PH) and a probe card.

Related Art

A semiconductor integrated circuit chip generally uses a probe card for an electrical test. The probe card includes a printed circuit board (PCB), a space transformer (ST) and a probe head (PH). The probe head mainly includes an upper guide plate, a lower guide plate, and a plurality of probes. Each probe includes a probe tail, a probe body, and a probe tip that are connected in sequence. The probe penetrates the upper guide plate and the lower guide plate. The probe tail of the probe penetrates out of the upper guide plate to be in contact with the space transformer to form an electrical connection, and the probe tip of the probe penetrates out of the lower guide plate to be in contact with a device under test to form an electrical connection.

The parallelism of the upper guide plate of the probe head is also different as an application area of the probe head is increasingly larger. Therefore, when the probe head is disposed on the space transformer, due to the parallelism difference of the upper guide plate, pressure between the probe tails of the probes and the space transformer also changes, and some probes may be overpressured during an assembly process. When the probe is overpressured, it is possible to cause a crack at the point where the probe penetrates the upper guide plate, and even worse, the probes may sink into the upper guide plate and thus be stuck. All these factors lead to the defect that a test yield is less than an expected test yield when the probe card is used subsequently.

SUMMARY

This disclosure discloses a probe head, including an upper guide plate, a lower guide plate, and a plurality of probes. The upper guide plate includes a bump, and the upper guide plate is provided with an upper surface and a lower surface that are opposite to each other and a plurality of probe holes vertically penetrating the upper surface and the lower surface along a first direction. The bump is disposed on the upper surface, and the bump is provided with a supporting surface. In the first direction, the upper surface is located between the supporting surface and the lower surface. The lower guide plate is disposed on the upper guide plate and located on the side of the lower surface. The probes are each provided with a probe tail, a probe body and a probe tip that are connected in sequence, and the probes are disposed in the probe holes and surround the bump. In the first direction, an end portion of the probe tail is located between the supporting surface and the upper surface.

This disclosure further discloses a probe card, including a circuit board, a space transformer and the foregoing probe head. The space transformer is provided with a plurality of electric contact points and is disposed on the circuit board. The probe head is disposed on the space transformer, and the probe tails of the probes of the probe head face the electric contact points respectively. The supporting surface abuts against the space transformer. A gap exists between the electric contact point and the end portion of the probe tail in the first direction.

This disclosure discloses a probe head, including an upper guide plate, a lower guide plate, and a plurality of probes. The upper guide plate includes a groove, and the upper guide plate is provided with an upper surface and a lower surface that are opposite to each other and a plurality of probe holes vertically penetrating the upper surface and the lower surface along a first direction. The groove is depressed from the upper surface, and the groove is provided with a groove bottom surface. In the first direction, the groove bottom surface is located between the upper surface and the lower surface. The lower guide plate is disposed on the upper guide plate and located on the side of the lower surface. The probes are each provided with a probe tail, a probe body and a probe tip that are connected in sequence, and the probes are disposed in the groove. In the first direction, an end portion of the probe tail is located between the groove bottom surface and the upper surface.

This disclosure further discloses a probe card, including a circuit board, a space transformer and the foregoing probe head. The space transformer is provided with a plurality of electric contact points and is disposed on the circuit board. The probe head is disposed on the space transformer, and probe tails of the probes of the probe head face the electric contact points respectively. An upper surface abuts against the space transformer. A gap exists between the electric contact point and an end portion of the probe tail in a first direction.

This disclosure discloses a probe head, including an upper guide plate, a lower guide plate, and a plurality of probes. The upper guide plate includes a bump, and the upper guide plate is provided with an upper surface and a lower surface that are opposite to each other and probe holes vertically penetrating the upper surface and the lower surface along a first direction. The bump is disposed on the upper surface, and the bump is provided with a supporting surface. In the first direction, the upper surface is located between the supporting surface and the lower surface. The lower guide plate is disposed on the upper guide plate and located on the side of the lower surface. The probes are each provided with a probe tail, a probe body and a probe tip that are connected in sequence. The probes arranged in the form of an array are disposed in an area surrounded by the bump, and in the first direction, an end portion of the probe tail is located between the supporting surface and the upper surface.

This disclosure further discloses a probe card, including a circuit board, a space transformer and the foregoing probe head. The space transformer is provided with a plurality of electric contact points and is disposed on the circuit board. The probe head is disposed on the space transformer, and the probe tails of the probes of the probe head face the electric contact points respectively. The supporting surface abuts against the space transformer. A gap exists between the electric contact point and the end portion of the probe tail in a first direction.

DETAILED DESCRIPTION

Figure 1:
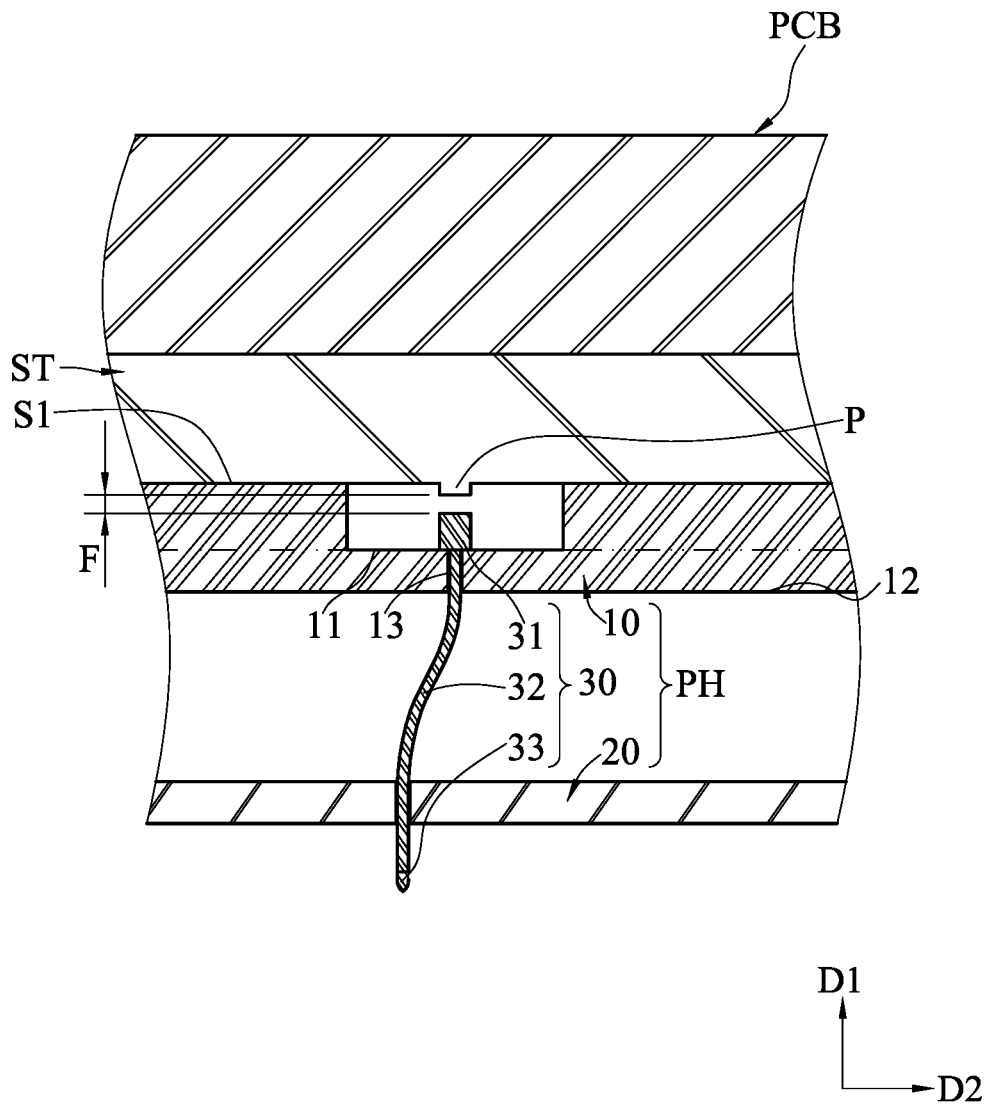
FIG. 1 is a schematic cross-sectional diagram taken along line 1-1 in the FIG. 2 of an embodiment of a probe card according to the present invention.

FIG. 1 is a schematic diagram of an embodiment of a probe card according to the invention, and the probe card in this embodiment is a vertical probe card. The probe card shown in the embodiment of FIG. 1 is assembled from a circuit board PCB, a space transformer (ST) and a probe head (PH). Therefore, the probe head PH is electrically connected to a device under test for an electrical test. The circuit board PCB and the space transformer ST are reflowed by a solder ball (not shown in the figure), or an anisotropic conductive adhesive, an elastic contact component and the like (not shown in the figure) are used as an intermediate conductor of the circuit board PCB and the space transformer ST, so that an internal circuit of the circuit board PCB is electrically connected to an internal circuit of the space transformer ST.

Still referring to FIG. 1, the probe head PH mainly include an upper guide plate 10, a lower guide plate 20, and a plurality of probes 30. The probe 30 is provided with a probe tail 31, a probe body 32, and a probe tip 33. The probe 30 penetrates the upper guide plate 10 and the lower guide plate 20. The probe tail 31 of the probe 30 is located on the side of the upper guide plate 10, and the probe tip 33 penetrates out of the lower guide plate 20. The probe head PH is suitable for assembling the space transformer ST or the circuit board PCB, so that the probe head PH is disposed on the space transformer ST. After the probe head PH of the present invention is disposed on the space transformer ST, a gap F (or referred to as a floating gap) can be maintained between an end portion of the probe tail 31 of each probe 30 and the space transformer ST. During the process of probe test, when overpressure occurs between the probe 30 of the probe head PH and the space transformer ST, the probe tail 31 of the probe 30 can be prevented from being abnormally sunk into a probe hole 13 of the upper guide plate 10 or cracking the probe hole 13.

Further, because the probe 30 is moved towards the space transformer ST during the process of probe testing, in this embodiment, the probe body 32 of the probe 30 is in a bucking shape. Therefore, the probe 30 may have a bending deformation area, that is, the probe tail 31 and the probe tip 33 of the probe 30 are not located in the same linear extension direction. In addition, directions of bending deformation of the probes 30 can be controlled.

To maintain the gap F after the probe head PH is disposed on the space transformer ST, the following specific embodiments may be implemented.

In an embodiment, FIG. 1 shows that the upper guide plate 10 of the probe head PH includes a bump. Herein, the upper guide plate 10 is of a plate-like structure and is provided with an upper surface 11 and a lower surface 12 that are opposite and parallel to each other. In addition, the upper guide plate 10 is provided with a plurality of probe holes 13 vertically penetrating the upper surface 11 and the lower surface 12 in a first direction D1, and the bump is provided with a supporting surface S1 and is disposed on the upper surface 11. In the first direction D1, the upper surface 11 is located between the supporting surface S1 and the lower surface 12. Therefore, the lower guide plate 20 is disposed on the upper guide plate 10 and located on the side of the lower surface 12.

Figure 2:
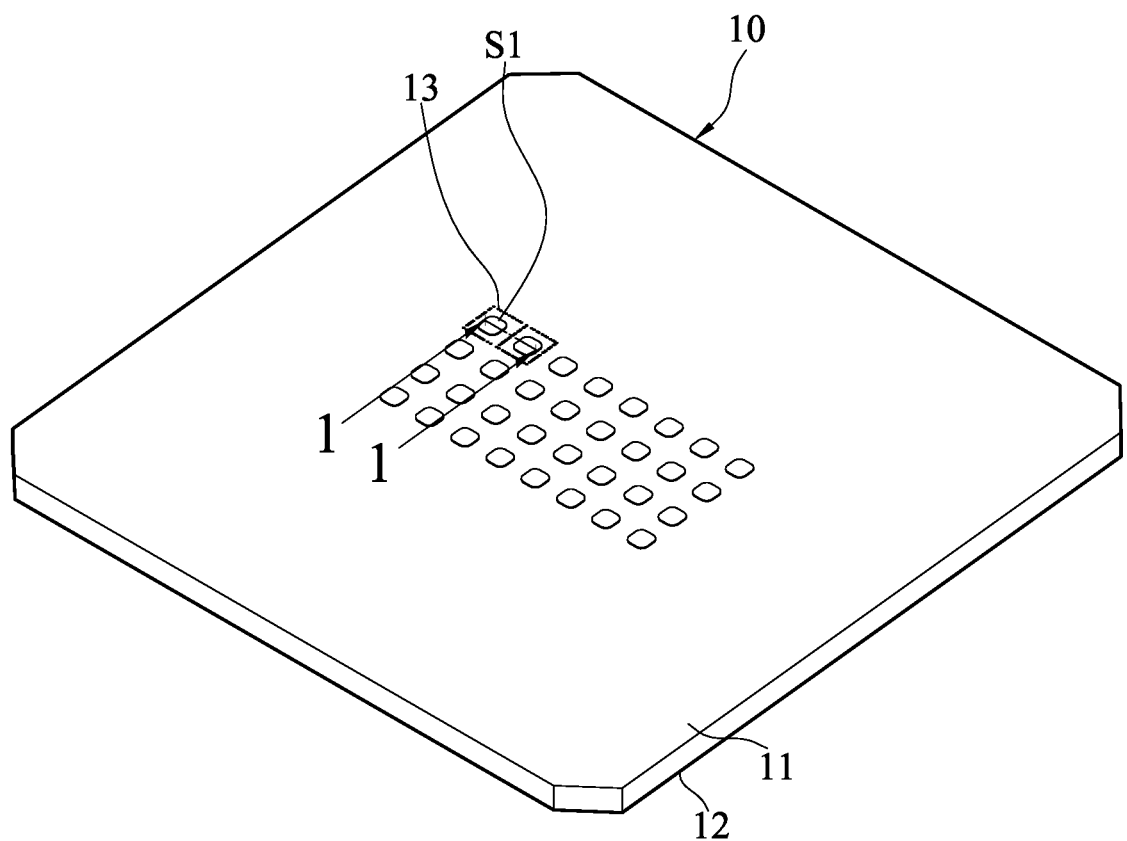
FIG. 2 is a schematic diagram of an embodiment in which an upper guide plate of a probe head is provided with a bump and probes are arranged peripherally according to the present invention.

Still referring to FIG. 1 and FIG. 2, in this embodiment, the probe holes 13 of the upper guide plate 10 are arranged surrounding the bump. Therefore, the probes 30 also surround the bump when being disposed in the probe holes 13. In a specific embodiment, for example, when the bump is a solid rectangular block, the probes 30 may be peripherally arranged into a rectangular shape along a rectangular outline shape of the bump. However, an arrangement manner of the probes 30 is not limited thereto, but may be determined by an arrangement shape or a position that conforms to a test contact point of a device under test.

In addition, in the first direction D1, the end portion of the probe tail 31 of each probe 30 is located between the supporting surface S1 and the upper surface 11. That is, a height of the bump in the first direction is greater than a length of the probe tail 31 of each probe 30. In this case, the end portion of the probe tail 31 of each probe 30 refers to an end, which is away from the probe tip 33, of the probe tail 31. Therefore, when the probes 30 are disposed on the upper guide plate 10, the end portions of the probe tails 31 of the probes 30 do not protrude from the bump. To be specific, when the upper guide plate 10 of the probe head PH is disposed on the space transformer ST, it can be ensured that the upper guide plate 10 of the probe head PH is in contact with the space transformer ST, so as to avoid unexpected contact with the probe tails 31 of the probes 30 during the assembly process, and prevent the probe tails 31 of the probes 30 from abnormally sinking into the probe holes 13 or cracking the probe holes 13 due to overpressure.

Further, still referring to FIG. 1, in an embodiment, on a side facing the probes 30, the space transformer ST is provided with electrical contact points P to be in contact with the probes 30 to form an electrical connection during the process of probe testing. Therefore, to maintain the gap F between the end portion of the probe tail 31 of each probe 30 and the space transformer ST, a distance between the upper surface 11 of the probe head PH and the supporting surface S1 of the bump in the first direction D1 is greater than a total length of the end portion of the probe tail 31 and the electrical contact point P in the first direction D1. Therefore, when the probe head PH is disposed on the space transformer ST and has not performed a probe test operation, the space transformer ST may still abut against the supporting surface S1 of each bump, and the gap F exists between the electrical contact point P of the space transformer ST and the end portion of the probe tail 31 of the probe 30 in the first direction D1. The electrical contact points P are connected to the internal circuit of the space transformer ST respectively.

It can be learned that, when disposed on the space transformer ST, the probe head PH is in contact with the space transformer ST by using the supporting surfaces S1 of the bumps on the upper guide plate 10 with a large area. In this way, a contact area between the upper guide plate 10 of the probe head PH and the space transformer ST increases, and during an assembly process, the possibility of deformation of the upper guide plate 10 is reduced. Therefore, this can ensure the parallelism after the probe head PH is disposed on the space transformer ST, and further ensure that the probe tails 31 of the probes 30 are not damaged by the pressure caused by the deformation of the upper guide plate 10. In addition, the gap F is maintained between the probe tails 31 of the probes 30 of the probe head PH and the space transformer ST, thereby preventing the probes 30 of the probe head PH from being damaged due to impact with the space transformer ST during the assembly process or during the process of probe testing.

Figure 4:
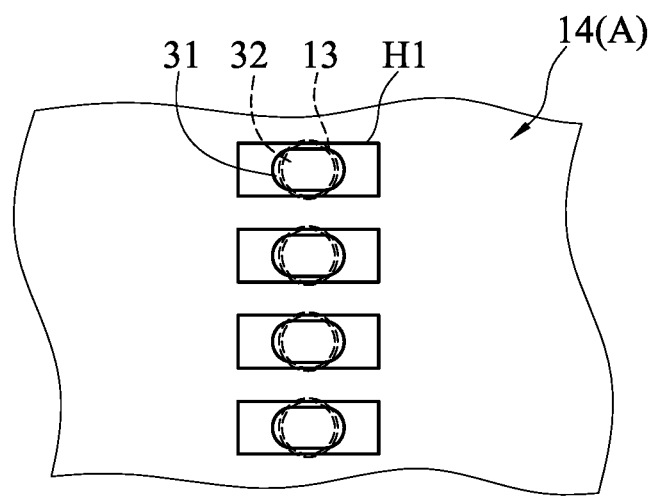
FIG. 4 is a schematic diagram of a locking member disposed on a probe head according to the present invention.

Further, referring to FIG. 4, in an embodiment, to prevent the probes 30 in the first direction D1 from randomly moving towards the lower guide plate 20, the probe tails 31 of the probes 30 are limited to a side, which is different from the lower guide plate 20, of the upper guide plate 10. Herein, cross-sectional shapes of the probe tails 31 of the probes 30 are non-circular shapes, and cross-sectional shapes of the probe bodies 32 of the probes 30 are circle shapes. In this way, when the probes 30 are disposed on the upper guide plate 10, the probe tails 31 of the probes 30 cannot penetrate the probe holes 13 and are kept on the side of the upper guide plate 10. In this state, the probe tail 31 of each probe 30 may form a stopper that limits the displacement of the probe 30 in the first direction D1, and the stopper formed by the probe tail 31 may prevent the probe 30 from falling out of the probe head PH from the probe hole 13 of the upper guide plate 10 and the probe hole of the lower guide plate 20. Specifically, the probe tail 31 of each probe 30 may be formed by, but is not limited to, deforming one end of the probe body 32 protruded from the upper guide plate 10 by the pressure, and the probe tail 31 is made into a flat shape whose width is greater than an outer diameter of the probe hole 13.

Figure 12:
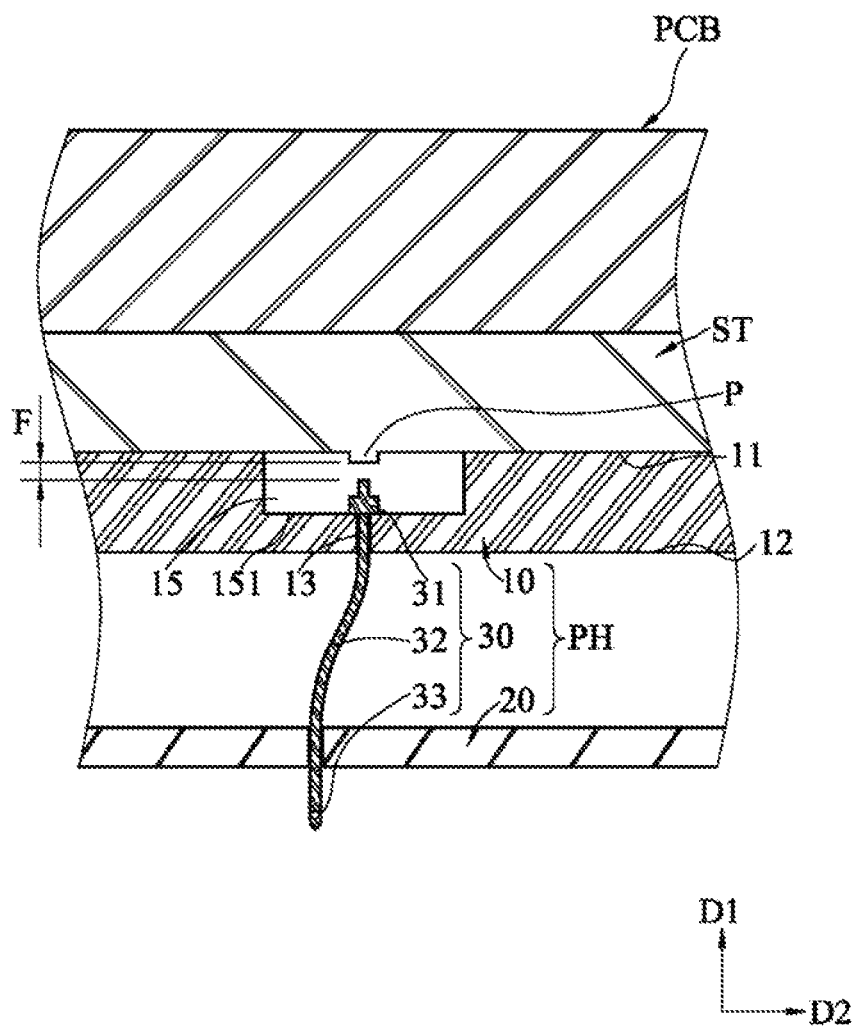
FIG. 12 is a schematic diagram of another embodiment of a probe card according to the present invention.

In an embodiment, referring to FIG. 12, a cross-sectional shape of the probe tail 31 of the probe 30 is partially non-circular and partially circular. The non-circular cross-sectional shape of the probe tail 31 of the probe 30 is located between the circular cross-sectional shape of the probe tail 31 of the probe 30 and the probe body 32. In this way, when the probes 30 are disposed on the upper guide plate 10, the probe tails 31 of the probes 30 cannot penetrate the probe holes 13 and therefore are kept on one side of the upper guide plate 10. In this state, the part with the non-circular cross-sectional shape of the probe tail 31 of each probe 30 may form a stopper that limits the displacement of the probe 30 in the first direction D1, and the stopper of the probe tail 31 may prevent the probe 30 from falling out of the probe head PH from the probe hole 13 of the upper guide plate 10 and the probe hole of the lower guide plate 20. Specifically, the probe tail 31 of each probe 30 may be formed by, but is not limited to, deforming, by applying a pressure, a part of an end of the probe body 32 which protrudes from the upper guide plate 10 so that the part with the non-circular cross-sectional shape of the probe tail is made into a flat shape. The width of the flat shape is greater than an outer diameter of the probe hole 13, and the width of the circular cross-sectional part of the probe tail 31 is less than the outer diameter of the probe hole 13.

In some embodiments, the upper guide plate 10 may be made of a single material or different materials, and may be formed integrally or by split parts. Referring to FIG. 1 and FIG. 2, the upper guide plate 10 and the bump shown in the embodiments of FIG. 1 and FIG. 2 are integrally formed with a single material. In this embodiment, the upper guide plate 10 and the bump are integrally formed with a ceramic material.

Further, to avoid the problem of interference of the probes 30 caused by the rotating action of the probes 30 on the upper guide plate 10, the probe head PH further includes a locking structure A, and the locking structure A is provided with a plurality of non-circular holes H1. The non-circular holes H1 are respectively connected to the probe holes 13. Herein, cross sections of the probe tails 31 of the probes 30 are non-circular, and the probe tails 31 of the probes 30 are received in the non-circular holes H1 respectively. Therefore, the probe tail 31 interferes with the non-circular hole H1, and the non-circular hole H1 may limit rotation of the probe 30 relative to the upper guide plate 10. That is, the probe 30 does not rotate relative to the upper guide plate 10 and the lower guide plate 20.

Figure 3:
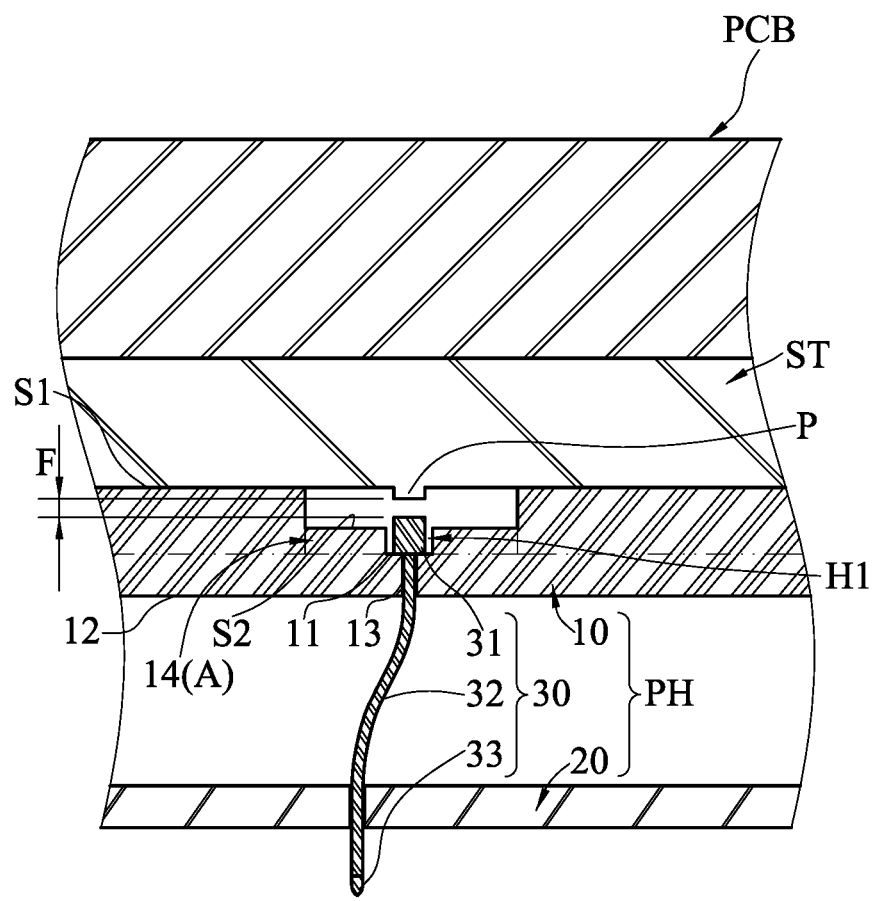
FIG. 3 is a schematic diagram of an embodiment in which an upper guide plate, a bump, and a locking block of a probe card are integrally formed according to the present invention.

Further, referring to FIG. 3, the embodiment in FIG. 3 further provides a locking structure A based on the structure foundation of the embodiment in FIG. 2. Herein, the upper guide plate 10 and the bump are integrally formed with a single material, and the upper guide plate 10 includes the locking structure A. In addition, in this embodiment, the locking structure A and the bump on the upper guide plate 10 integrally form a locking block 14, and the locking block 14 is provided with a plurality of non-circular holes H1, so as to limit the rotation of the probes 30. Herein, the cross-sectional shape of the probe tail 31 of the probe 30 is a non-circular shape. When the probe tail 31 of the probe 30 is received in the non-circular hole H1, the rotation momentum of the probe tail 31 of the probe 30 is limited by the non-circular hole H1, and therefore the probe tail is locked. For example, the cross section of the probe tail 31 of the probe 30 may be, but is not limited to, a square circle, that is, two corresponding sides are parallel to each other and the other two corresponding sides are in a circular arc shape; the non-circular hole H1 is a rectangular hole. The probe tail 31 is received in the non-circular hole H1 and therefore can be locked by the non-circular hole H1. In other embodiments, the cross-sectional shape of the probe tail 31 of the probe 30 is a square circle shape, and the non-circular hole H1 may be a square circular hole or an elliptical hole. The cross-sectional shape of the probe tail 31 of the probe 30 and the shape of the non-circular hole H1 are not specifically limited as long as sizes are properly configured (for example, the non-circular hole H1 cannot be excessively large compared with the probe tail 31). When the probe tail 31 of the probe 30 is received in the non-circular hole H1, the probe tail 31 of the probe 30 can be locked by the non-circular hole H1.

Specifically, the locking block 14 is disposed on the upper surface 11. In an embodiment, the locking structure A is further provided with a step surface S2, and the step surface S2 and the supporting surface S1 are not coplanar and become stepped. In this embodiment, the locking block 14 is provided with the step surface S2, and the step surface S2 is adjacent to the non-circular hole H1 and the bump. In the first direction, the step surface S2 is located between the supporting surface S1 and the upper surface 11. Therefore, by setting the step surface S2, it is more applicable to configure the bumps and the probe holes 13 at different relative positions.

In this embodiment, when the probes 30 penetrate from the upper guide plate 10 to the lower guide plate 20, the probe tips 33 of the probes 30 penetrate the non-circular holes H1 and the probe holes 13 and further penetrate the lower guide plate 20. The probe bodies 32 of the probes 30 penetrate the non-circular holes H1 and the probe holes 13 and can be received in the probe holes 13 and a receiving space between the upper guide plate 10 and the lower guide plate 20. The probe tails 31 of the probes 30 are received in the non-circular holes H1. Therefore, the probe tails 31 of the probes 30 may be limited by the non-circular holes H1, so that the rotations of the probes 30 is limited.

Figure 5:
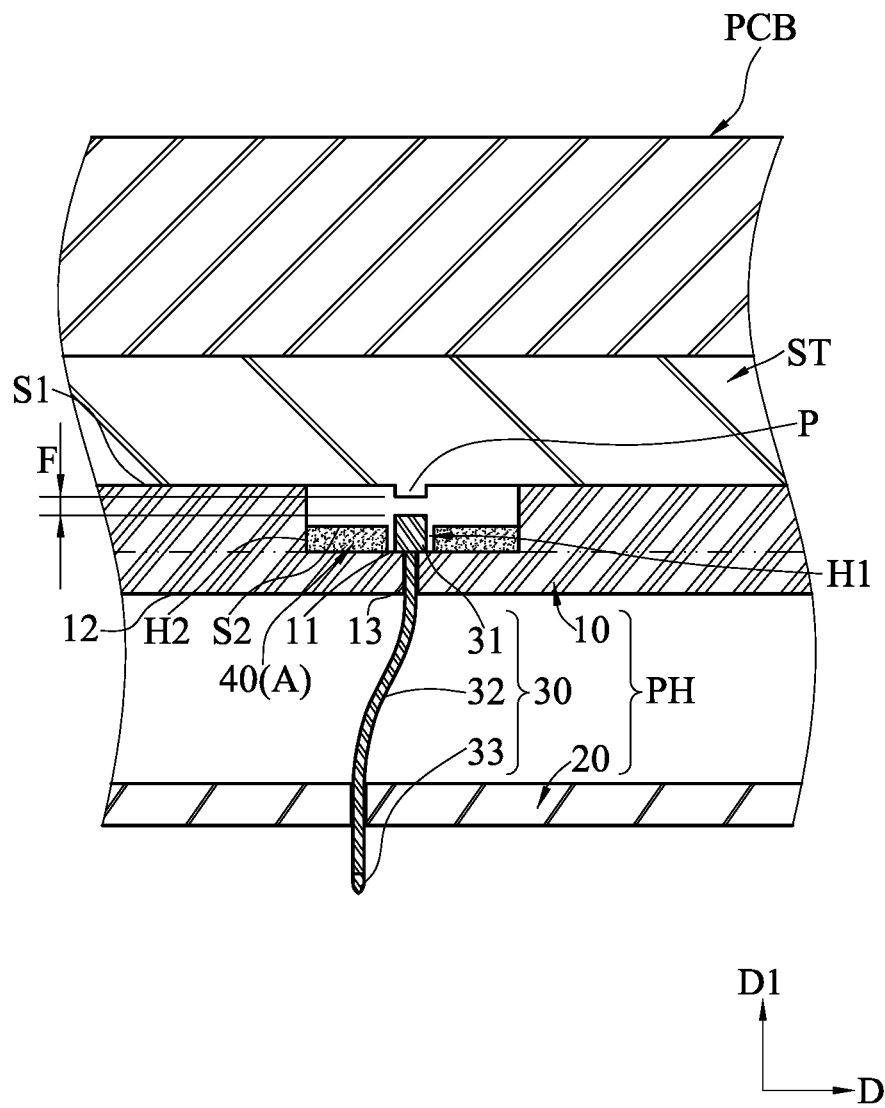
FIG. 5 is a schematic diagram of an embodiment in which an upper guide plate and a bump of a probe card are integrally formed and a locking member is additionally provided according to the present invention.

In the embodiment in which the locking structure A is provided to limit the rotation of the probes 30, it is also possible to use a split structure configuration with different materials. Specifically, referring to FIG. 5, similarly, the embodiment in FIG. 5 further provides the locking structure A based on the structure foundation of the embodiment in FIG. 2. In this embodiment, the upper guide plate 10 and the bump are integrally formed with a ceramic material, and the locking structure A is a locking member 40 separated from the upper guide plate 10 and the bump. Herein, the locking member 40 may be a thin film material disposed on the upper guide plate 10, and the locking member 40 is provided with a plurality of non-circular holes H1. In this embodiment, the locking member 40 is disposed on the upper surface 11, and the non-circular holes H1 of the locking member 40 are connected to the probe holes 13 of the upper guide plate 10. In this way, when the probes 30 penetrate from the upper guide plate 10 to the lower guide plate 20, the probe tips 33 of the probes 30 penetrate the non-circular holes H1 and the probe holes 13 and further penetrate the lower guide plate 20. The probe bodies 32 of the probes 30 penetrate the non-circular holes H1 and the probe holes 13 and can be received in the probe holes 13. The probe tails 31 of the probes 30 are received in the non-circular holes H1. Therefore, the probe tails 31 of the probes 30 may be limited by the non-circular holes H1, so that the rotation of the probes 30 can be limited. In an embodiment, the locking member 40 may alternatively be provided with a step surface S2, and the step surface S2 is adjacent to the non-circular holes H1 and the bump.

Further, in some embodiments, the locking member 40 may be a single piece made of a thin film material. Still referring to FIG. 5, the locking member 40 is provided with the step surface S2 and the non-circular hole H1, and the locking member 40 is further provided with a punched hole H2 corresponding to a configuration position of the bump on the upper guide plate 10. A shape of the punched hole H2 corresponds to an outline shape of the bump. Herein, the position configuration of the non-circular hole H1 relative to the punched hole H2 corresponds to the position configuration of the probe 30 relative to the bump. In this embodiment, the punched hole H2 surrounds the non-circular hole H1. In this way, the locking member 40 is disposed on the upper surface 11 of the upper guide plate 10, and the punched hole H2 is sleeved on the bump. The non-circular hole H1 is connected to the probe hole 13. That is, the bump formed by the locking member 40 is disposed on the punched hole H2 and is disposed on the upper surface 11 of the upper guide plate 10. Herein, the probes 30 first penetrate the locking member 40 and then penetrate the upper guide plate 10, and the probe tails 31 of the probes 30 are received in the non-circular holes H1 of the locking member 40 and locked by the non-circular holes H1. By cutting a plurality of pattern structures on a thin film and arranging the plurality of pattern structures on the upper surface 11 of the upper guide plate 10 by means of splicing, the locking member 40 correspondingly provides the function of locking each probe 30.

Figure 6:
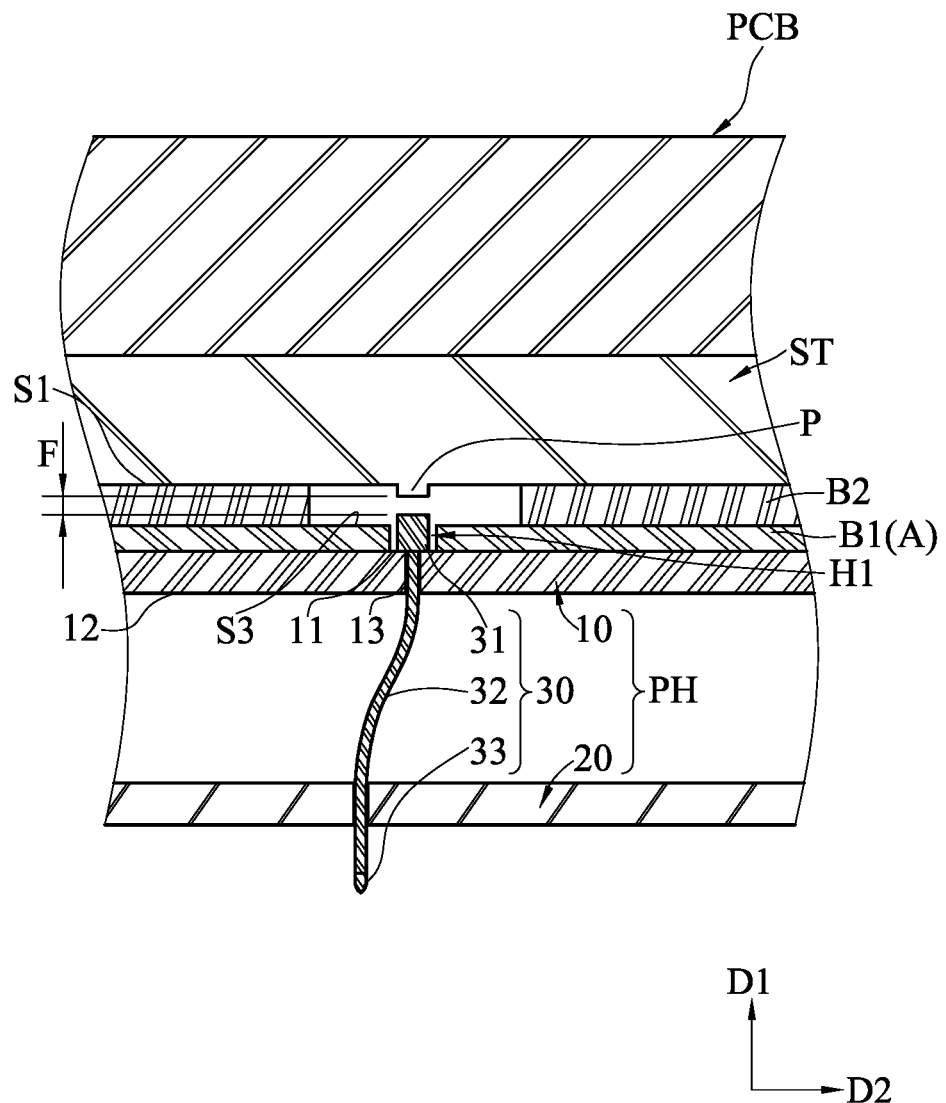
FIG. 6 is a schematic diagram of an embodiment in which an upper guide plate of a probe card is of a three-piece type according to the present invention.

In other embodiments, referring to FIG. 6, the embodiment in FIG. 6 is also based on the structure foundation of the embodiment in FIG. 2. To be specific, the embodiment in FIG. 6 is also based on the structure foundation of disposing the bump on the upper guide plate 10. In this embodiment, the upper guide plate 10 is a three-piece split structure made of different materials. Specifically, the bump of the upper guide plate 10 is separable from the upper guide plate 10, and the bump is further divided into two separable parts. In this embodiment, the bump includes the locking structure A and a height setting layer B2, and the locking structure A is a locking layer B1 separable from the height setting layer B2. In this embodiment, the locking layer B1 is disposed on the upper surface 11 and provided with a median surface S3 and a plurality of non-circular holes H1. The height setting layer B2 is disposed on a part of the median surface S3 and provided with a supporting surface S1, and in the first direction D1, the median surface S3 is located between the supporting surface S1 and the upper surface 11. Herein, the height setting layer B2 is disposed at a part of the median surface S3 and the remaining parts of the median surface S3 are in an exposed state. In this case, the locking layer B1 and the height setting layer B2 become a stepped structure, while the remaining parts of the median surface S3 (the exposed parts of the median surface S3) are equivalent to the step surface S2 in the foregoing embodiments.

Similarly, in this embodiment, the non-circular holes H1 of the locking layer B1 are connected to the probe holes 13. When the probes 30 penetrate from the upper guide plate 10 to the lower guide plate 20, the probe tips 33 of the probes 30 penetrate the non-circular holes H1 and the probe holes 13 and further penetrate the lower guide plate 20. The probe bodies 32 of the probes 30 penetrate the non-circular holes H1 and the probe holes 13 and can be received in the probe holes 13. The probe tails 31 of the probes 30 are received in the non-circular holes H1. Therefore, the probe tails 31 of the probes 30 may be limited by the non-circular hole H1, so that the rotation of the probes 30 can be limited.

In this embodiment, the locking layer B1 and the height setting layer B2 may be made of the ceramic material or the thin film material respectively. Herein, the three-piece split structure of the upper guide plate 10, the locking layer B1, and the height setting layer B2 refers to a three-piece structure at a processing stage. The upper guide plate 10, the locking layer B1, and the height setting layer B2 are combined into an inseparable single structure once processed respectively. Because the upper guide plate 10, the locking layer B1, and the height setting layer B2 are the three-piece split structure at the processing stage, the upper guide plate 10, the locking layer B1, and the height setting layer B2 may be simultaneously processed in different places, so as to shorten the processing time. In addition, the upper guide plate 10, the locking layer B1, and the height setting layer B2 are combined after respectively processed. Therefore, when the form of the probe 30 of the probe head PH varies, the size and shape of the probe body 32 or the probe tail 31 based on the probe 30 are different. In this embodiment, the upper guide plate 10, the locking layer B1, and the height setting layer B2 can be combined after the form of the probe hole 13 of the upper guide plate 10 and the form of the non-circular hole H1 of the locking layer B1 are respectively changed during processing, so as to be more applicable to different forms of probes 30.

In addition, in the foregoing embodiments, a higher ratio of an area of the supporting surface S1 to a cross-sectional area of the upper guide plate 10 in a direction perpendicular to the first direction D1 is desired. In this embodiment, a ratio of the area of the supporting surface S1 to the cross-sectional area of the upper guide plate 10 in a second direction D2 is preferably higher than 70%. Therefore, it is ensured that when probe head PH is disposed on the space transformer ST, the upper guide plate 10 can be stably supported by the space transformer ST without being deformed, so as to maintain the parallelism between the upper guide plate 10 and the space transformer ST, thereby further preventing the probes 30 from abnormally sinking into the probe holes 13 or cracking the probe holes 13.

Figure 7:
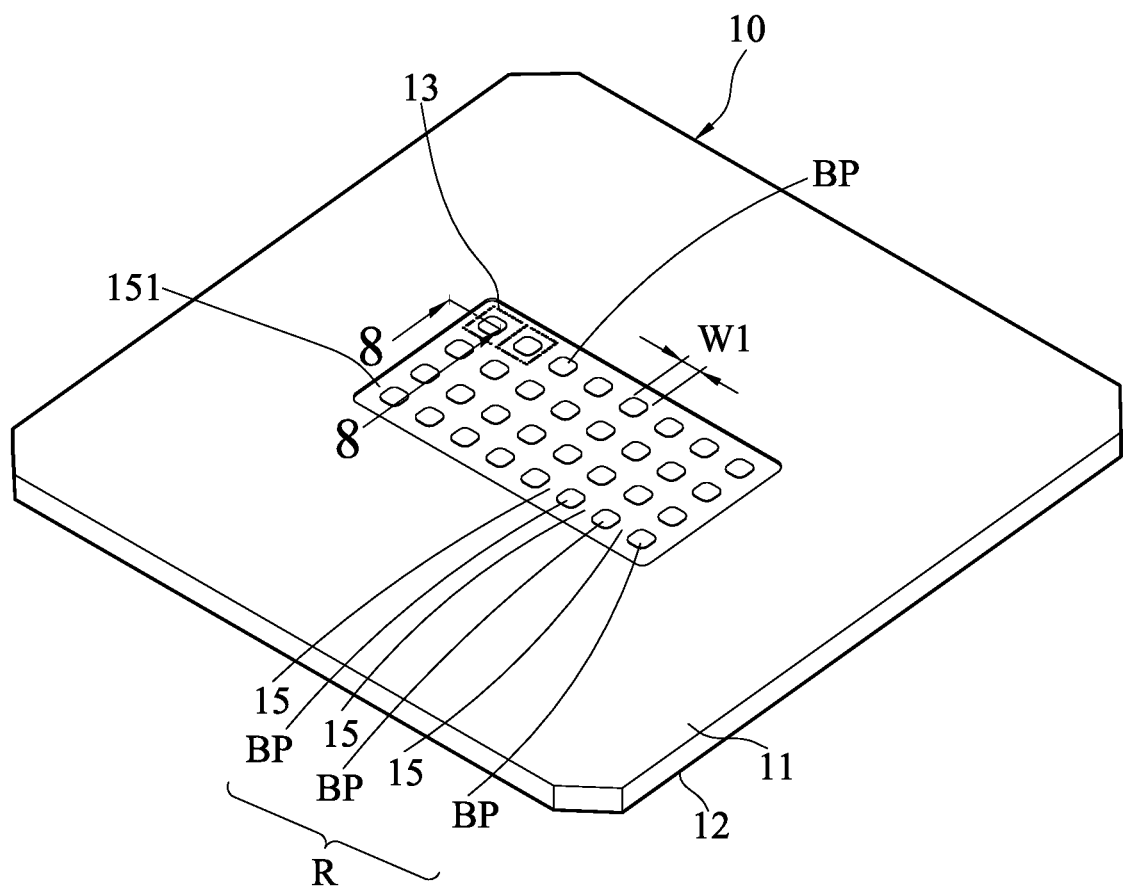
FIG. 7 is a schematic diagram of an embodiment in which an upper guide plate of a probe head is provided with a groove according to the present invention.
Figure 8:
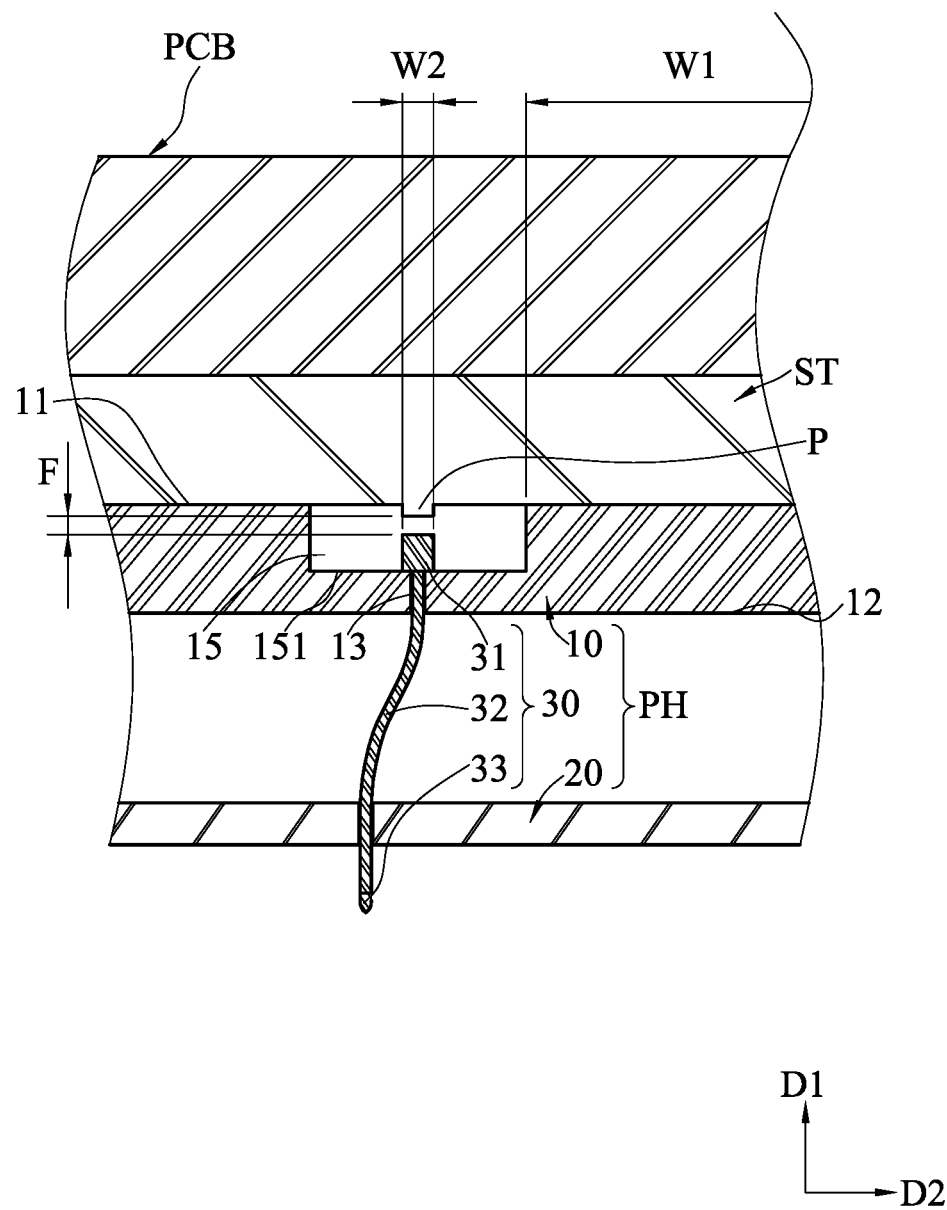
FIG. 8 is a schematic cross-sectional diagram taken along line 8-8 in the FIG. 7 of an embodiment in which an upper guide plate of a probe head is provided with a grid-shaped groove according to the present invention.

In another embodiment, referring to FIG. 7 and FIG. 8, FIG. 7 and FIG. 8 show a structure in which the upper guide plate 10 includes a recessed portion R, the recessed portion R includes a plurality of grooves 15 and a plurality of bulged portions BP. In this embodiment, the recessed portion R is depressed from the upper surface 11, each of the bulged portions BP is disposed in the recessed portion R. The plurality of grooves 15 are formed between the bulged portions BP and the groove 15 is provided with a groove bottom surface 151, each of the bulged portions BP is provided with a top surface. The top surface of the bulged portion BP is a part of the upper surface and provided for abutting against the space transformer ST. In the first direction D1, the groove bottom surface 151 is located between the upper surface 11 and the lower surface 12. In this embodiment, the probes 30 are disposed in the groove 15, and the probes 30 may be arranged in the groove 15 in the form of an array or peripherally, but is not limited thereto. When the probes 30 are disposed in the groove 15, in the first direction D1, the end portions of the probe tails 31 of the probes 30 are located between the groove bottom surface 151 and the upper surface 11, and the length of the tail 31 is less than the height of the groove 15.

Further, in this embodiment, the arrangement manner of the probes 30 in the recessed portion R may be different depending on the shape of the recessed portion R. In an embodiment, the recessed portion R of the upper guide plate 10 may be, but is not limited to, rectangular or a circular (not shown in the figure). Herein, based on the shape of the recessed portion R of the upper guide plate 10, the groove bottom surface 151 is a flat plane. Therefore, the probes 30 are arranged in the groove 15 in the form of a matrix. For example, when the shape of the recessed portion R of the upper guide plate 10 is a rectangle, the probes 30 may be arranged in the recessed portion R in the form of a matrix.

In an embodiment, referring to FIG. 7, the recessed portion R of the upper guide plate 10 may alternatively be in a grid shape. Herein, based on the fact that the recessed portion R is in the grid shape, the bottom surface of the recessed portion R is also correspondingly in the grid shape. In this way, the probes 30 may be arranged along the grid-shaped recessed portion R, thereby being arranged peripherally.

Figure 9:
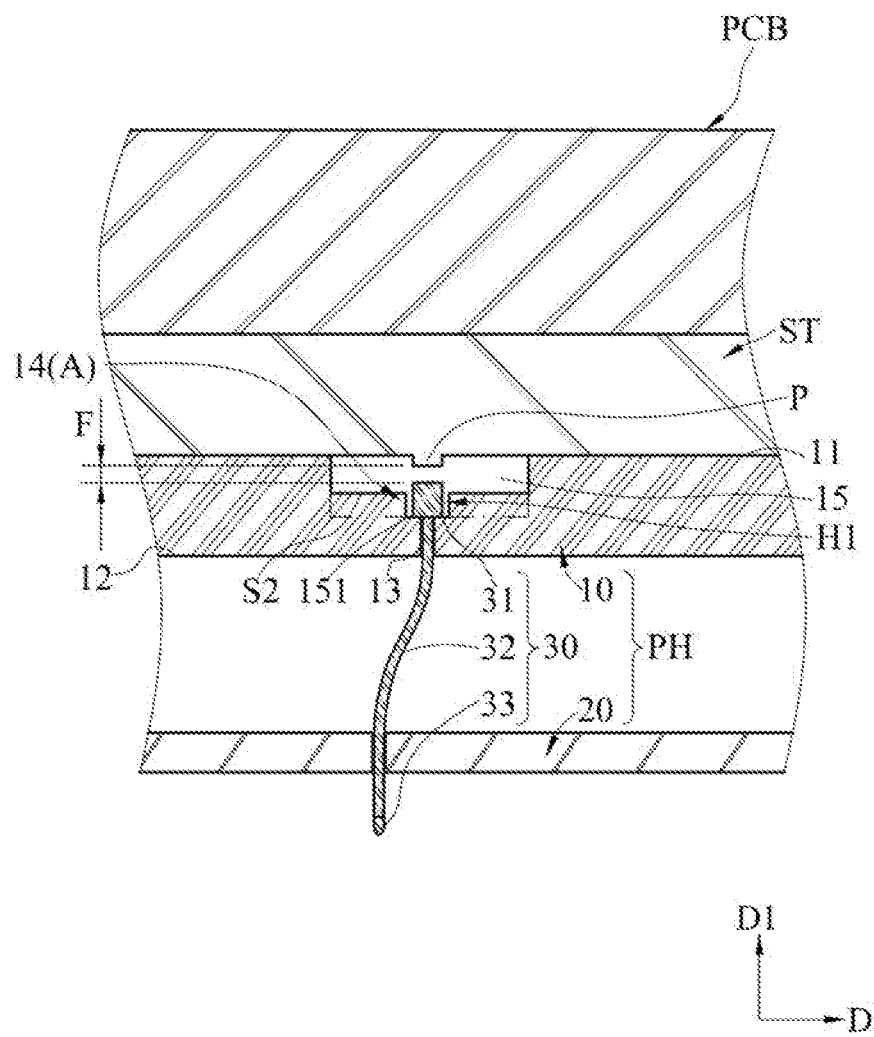
FIG. 9 is a schematic diagram of an embodiment in which an upper guide plate of a probe card is provided with a groove and a locking block according to the present invention.

Further, referring to FIG. 9, the embodiment in FIG. 9 has the same structure foundation as the embodiments in FIG. 7 and FIG. 8, that is, the upper guide plate 10 is provided with the groove 15 and the probes 30 are arranged peripherally. In this embodiment, the probes 30 are disposed in the groove 15, and the upper guide plate 10 further includes a locking structure A. In addition, in this embodiment, the locking structure A is a locking block 14 integrally formed with the same material as the upper guide plate 10. The structure of the locking block 14 is the same as the foregoing embodiments, and is provided with non-circular holes H1 connected to the probe holes 13 and may be provided with a step surface S2. The difference is that the locking block 14 in this embodiment is disposed on the groove bottom surface 151 of the groove 15. Therefore, in this embodiment, the step surface S2 of the locking block 14 is adjacent to the non-circular holes H1 and the upper guide plate 10, and the step surface S2 of the locking block 14 and the upper surface 11 are not coplanar and become stepped. In addition, the step surface S2 is located between the upper surface 11 and the groove bottom surface 151. Similarly, the probe tails 31 of the probes 30 can be received in the non-circular holes H1 and locked by the non-circular holes H1.

Figure 10:
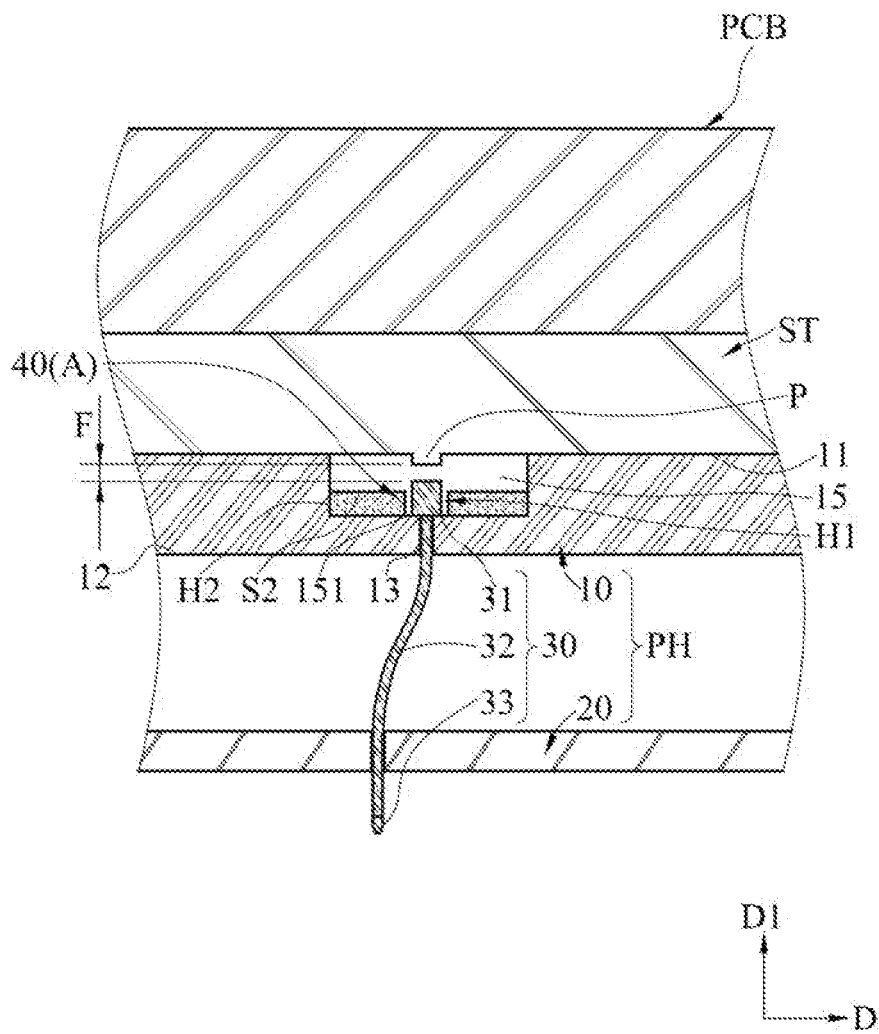
FIG. 10 is a schematic diagram of an embodiment in which an upper guide plate of a probe card is provided with a groove and a locking block is additionally provided according to the present invention.

In addition, referring to FIG. 10, the embodiment in FIG. 10 has the same structure foundation as the embodiments in FIG. 7 and FIG. 8, that is, the upper guide plate 10 is provided with the recessed portion R and the probes 30 are arranged peripherally. In this embodiment, the upper guide plate 10 is further provided with a locking structure A, and the locking structure A is a locking member 40. In this embodiment, the locking member 40 is disposed on the bottom surface of the recessed portion R. In addition, when the probes 30 in the groove 15 are arranged in the form of an array, the locking member 40 without the punched hole H2 is provided. When the shape of the recessed portion R is the grid shape, the locking member 40 having the punched hole H2 is provided, and the punched hole H2 of the locking member 40 is sleeved on a bulged portion BP between the grid-shaped recessed portion R.

Further, in the embodiments in which the probes 30 are disposed in the groove 15, as shown in FIG. 7 to FIG. 10, because the locking block 14 or the locking member 40 is disposed on the groove bottom surface 151 lower than the upper surface 11, the end portions of the probe tail 31s of the probes 30 are located between the upper surface 11 and the groove bottom surface 151. That is, when the probe head PH is disposed behind the space transformer ST, the upper surface 11 of the upper guide plate 10 of the probe head PH is in contact with the space transformer ST. Therefore, in the embodiments in which the probes 30 are disposed in the groove 15, a higher ratio of an area of the upper surface 11 to a cross-sectional area of the upper guide plate 10 in the second direction D2 is desired. Therefore, the ratio of the area of the upper surface 11 to the cross-sectional area of the upper guide plate 10 in the second direction D2 is greater than 70%. In this way, in the embodiments in which the probes 30 are disposed in the groove 15, it is ensured that when the probe head PH is disposed on the space transformer ST, the upper guide plate 10 can be stably supported by the space transformer ST without being deformed, so as to maintain the parallelism between the upper guide plate 10 and the space transformer ST, thereby preventing the probes 30 from abnormally sinking into the probe holes 13 or cracking the probe holes 13.

Figure 11:
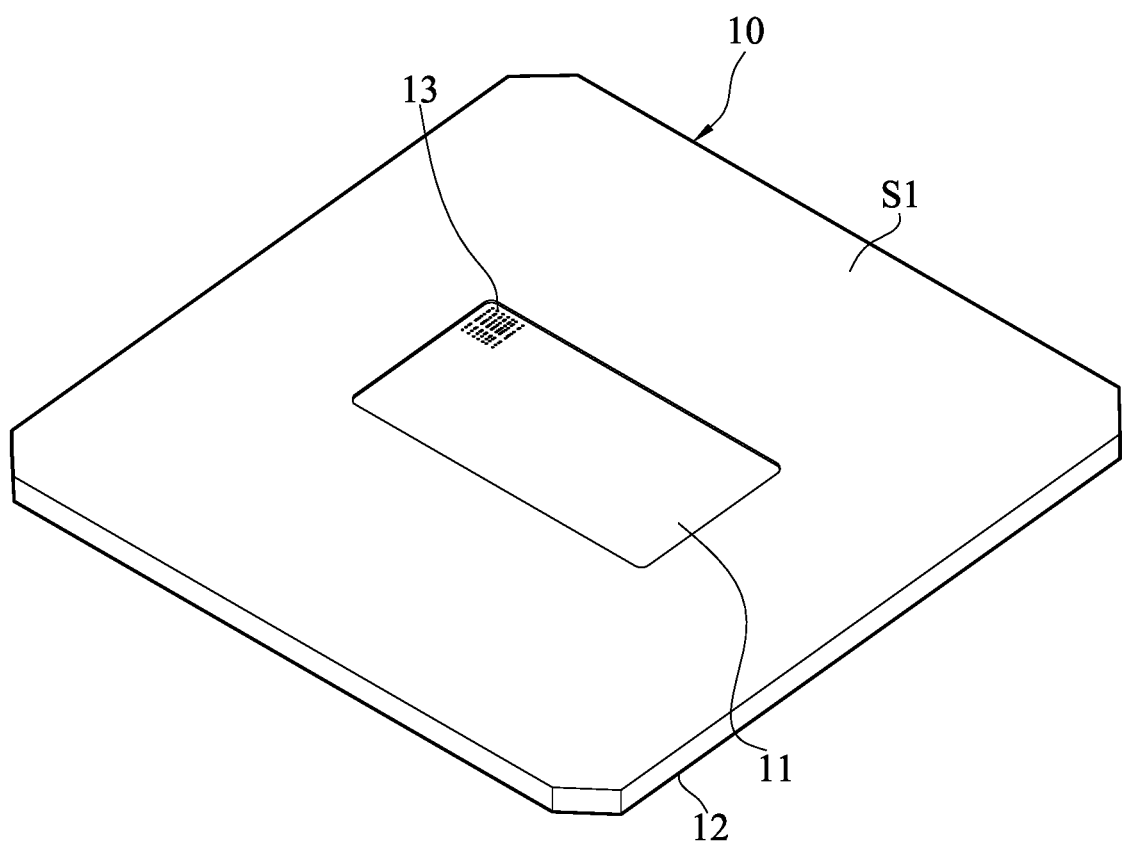
FIG. 11 is a schematic diagram of an embodiment in which a probe card is provided with a bump and a probe array is disposed in the bump according to the present invention.

Referring to FIG. 11, in an embodiment, the same as the embodiment in FIG. 1, the upper guide plate 10 also includes a bump, and the end portions of the probe tails 31 of the probes 30 are also located between the supporting surface S1 and the upper surface 11. The difference is that the probes 30 in this embodiment are arranged in the form of an array and are disposed within an area surrounded by the bump. In a specific embodiment, the bump on the upper guide plate 10 may be, but is not limited to, a closed contour shape, for example, a hollow square. In this way, after the probe head PH is disposed on the space transformer ST, a gap F may also be maintained between the end portion of the probe tail 31 of the probe 30 and the space transformer ST.

Certainly, the same as the embodiment in FIG. 1 in which the upper guide plate 10 includes the bump, the upper guide plate 10 may be integrally formed with the bump and the locking block 14 by using the same material. Alternatively, it is possible that the upper guide plate 10 and the bump are integrally formed by using the same material, and then the locking member 40 made of a different material is separately provided. Alternatively, it is possible that the upper guide plate 10 is made of a single material, and the bump including the locking layer B1 and the height setting layer B2 is made of different materials separately.

In conclusion, when disposed on the space transformer ST, the probe head PH in the foregoing embodiments of this disclosure can always abut against the space transformer ST by using the supporting surface S1 or the upper surface 11. Therefore, the upper guide plate 10 can be supported to reduce the deformation. Further, based on the state in which the upper guide plate 10 can maintain stability without deformation, the probes 30 disposed on the upper guide plate 10 can maintain parallelism and a gap with the space transformer ST. Therefore, the probes 30 and the upper guide plate 10 can be prevented from being damaged during the process of probe testing.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A probe head suitable for assembling the space transformer having plurality of electrical contact points, the probe head comprising:
   an upper guide plate comprising a recessed portion, the recessed portion comprising a plurality of grooves and a plurality of bulged portions, wherein the upper guide plate is provided with an upper surface and a lower surface that are opposite to each other and a plurality of probe holes, the groove is depressed from the upper surface, the groove is provided with a groove bottom surface, the plurality of probe holes are vertically penetrated the groove bottom surface and the lower surface along a first direction, and in the first direction, the groove bottom surface is located between the upper surface and the lower surface, each of the bulged portions is disposed in the recessed portion and protrudes from the groove bottom surface, the plurality of grooves are formed between the bulged portions, each of the bulged portions is provided with a top surface, wherein the top surface is a part of the upper surface, the top surface of the bulged portion is provided for abutting against the space transformer;
   a lower guide plate, disposed on the upper guide plate and located on the side of the lower surface; and
   a plurality of probes, each provided with a probe tail, a probe body and a probe tip that are connected in sequence, wherein the plurality of probes is disposed in the recessed portion, each of the grooves includes at least one probe, the probe tail forms a stopper, the plurality of probes is arranged in the form of an array or peripherally, the plurality of probes is disposed in the probe holes and surrounds the bulged portion, and in the first direction, an end portion of the probe tail is located between the groove bottom surface and the upper surface, in a second direction perpendicular to the first direction, a width of the bulged portion (W1) is bigger than a width of the stopper (W2), the probe tail is provided for facing to the plurality of electrical contact points of the space transformer.

2. The probe head according to claim 1, wherein the recessed portion is in a rectangle shape, and the plurality of probes arranged in the form of an array is disposed in the recessed portion.

3. The probe head according to claim 1, wherein the recessed portion is in a grid shape, and the plurality of probes is arranged in a grid shape in the recessed portion.

4. The probe head according to claim 1, wherein a ratio of an area of the upper surface to a cross-sectional area of the upper guide plate in the second direction is greater than 70%.

5. The probe head according to claim 1, wherein a length of the probe tail in the first direction is less than a height of the groove.

6. The probe head according to claim 5, wherein the probe tail has a non-circular cross-sectional shape, the probe body has a circular cross-sectional shape, and the probe tail forms a stopper.

7. A probe card, comprising:
   a circuit board; and
   a space transformer, disposed on the circuit board, wherein the space transformer is provided with a plurality of electric contact points; and
   the probe head according to claim 1, disposed on the space transformer, wherein the probe tails of the plurality of probes of the probe head face the plurality of electrical contact points respectively, the upper surface abuts against the space transformer, and a gap exists between the electrical contact point and the end portion of the probe tail in the first direction.

8. A probe head suitable for assembling the space transformer having plurality of electrical contact points, the probe head comprising:
   an upper guide plate comprising a recessed portion, the recessed portion comprising a plurality of grooves and a plurality of bulged portions, wherein the upper guide plate is provided with an upper surface and a lower surface that are opposite to each other and a plurality of probe holes, the groove is depressed from the upper surface, the groove is provided with a groove bottom surface, the plurality of probe holes are vertically penetrated the groove bottom surface and the lower surface along a first direction, and in the first direction, the groove bottom surface is located between the upper surface and the lower surface, each of the bulged portions is disposed in the recessed portion and protrudes from the groove bottom surface, the plurality of grooves are formed between the bulged portions, each of the bulged portions is provided with a top surface, wherein the top surface is a part of the upper surface, the top surface of the bulged portion is provided for abutting against the space transformer;

a lower guide plate, disposed on the upper guide plate and located on the side of the lower surface; and a plurality of probes, each provided with a probe tail, a probe body and a probe tip that are connected in sequence, wherein the plurality of probes is disposed in the recessed portion, each of the grooves includes at least one probe, the probe tail forms a stopper, the plurality of probes is arranged in the form of an array or peripherally, the plurality of probes is disposed in the probe holes and surrounds the bulged portion, and in the first direction, an end portion of the probe tail is located between the groove bottom surface and the upper surface, a contact area of the bulged portion is bigger than a contact area of the stopper, the probe tail is provided for facing to the plurality of electrical contact points of the space transformer.

* * * * *